United States Patent [19]

Bayer et al.

[11] 4,441,065

[45] Apr. 3, 1984

[54] METHOD AND APPARATUS FOR DETERMINING THE ROTOR RESISTANCE OF AN ASYNCHRONOUS MACHINE

[75] Inventors: Karl-Heinz Bayer; Felix Blaschke, both of Erlangen, Fed. Rep. of Germany

[73] Assignee: Siemens AG, Berlin & Munich, Fed. Rep. of Germany

[21] Appl. No.: 292,724

[22] Filed: Aug. 13, 1981

[30] Foreign Application Priority Data

Sep. 11, 1980 [DE] Fed. Rep. of Germany ....... 3034251

[51] Int. Cl.$^3$ .............................................. H02P 5/40
[52] U.S. Cl. .............................. 318/808; 324/158 MG; 318/803
[58] Field of Search ........ 318/803, 808, 807, 809–811, 318/702, 490; 324/158 MG

[56] References Cited

U.S. PATENT DOCUMENTS 3,775,649 11/1973 Bayer et al. .......................... 318/702
3,909,688  9/1975 Blaschke et al. ..................... 318/702

OTHER PUBLICATIONS

Nabe, A., "An Approach to Flux Control Of Induction Motors Operated With Variable Frequency Power Supply", IAS78: 30C, pp. 890–896.
Blaschke, F. et al., "Verfahren zur Felderfassung Bei der Regelung Stromrichtergespeister Asynchronmaschinen, *Messen Steuern Regeln,* No. 12, Apr. 19, 1975, pp. 278–280.

*Primary Examiner*—David Smith, Jr.
*Attorney, Agent, or Firm*—Karl F. Milde, Jr.; Andrew G. Rodau

[57] ABSTRACT

Disclosed is a method to detect the rotor resistance of an asynchronous machine, wherein a first vector attached to the emf of the machine is determined by computing the emf-vector or the flux vector from the stator voltages and the stator currents; wherein a flux attached to an arithmetic model circuit is determined, whereas the arithmetic model circuit uses the stator currents and the rotor position of the machine and an adjustable model parameter for the rotor resistance as basic quantities and imitates the dynamic events leading to the magnetic flux of the machine; wherein a difference of two quantities is determined, wherein the first quantity represents a defining quantity of the first vector attached to the machine and the second quantity represents a respective defining quantity of a second vector derivable from the imitated flux and that the setting of a model parameter is varied until the value of the difference is a minimum, whereas the model parameter corresponding to the minimum of the difference is regarded as the resulting rotor resistance of the machine.

15 Claims, 8 Drawing Figures

METHOD AND APPARATUS FOR DETERMINING THE ROTOR RESISTANCE OF AN ASYNCHRONOUS MACHINE

BACKGROUND OF THE INVENTION

1. Field of the Invention

The invention relates to a method and a device for determining the rotor resistance of an asynchronous electrical motor machine.

Modern highly dynamic four-quadrant rotating machinery such as asynchronous machines make use of a field-oriented control system. In a field-oriented control system, nominal values of the currents flowing in the stator windings assembled to a stator current vector c are preset so as to receive a predetermined angle between the vector of the normal stator current and the axis of the magnetic field of a motor using a rotating field. Using the magnetic flux vector $\psi$ to describe the magnetic field within the field-oriented control system and by knowing the angular position of the flux vector the field-oriented control system allows presetting of the component $i_{\psi 1}$ of the stator current parallel to the flux vector (magnetizing current) and the component $i_{\psi 2}$ perpendicular to the flux vector (active current), independently from each other, to adjust the magnetic field strength by the magnetizing current and to adjust the rotor speed and the engine torque, respectively, by the active current.

The necessary information about the magnetic flux $\psi$ can be obtained by subtracting the ohmic voltage drop from the phase voltages of the machine, assembled to a vector according to the assemblance of the stator current vector and by forming the stator emf-vector hereafter. The position of the flux vector of the rotor can be obtained by integrating and then subtracting the component determined by the inductive stray voltage. Obtaining the flux vector in this way, based substantially on the voltage vector, can be named "voltage model". This model frequently meets the demands for accuracy and control dynamics in the operation of the asynchronous machine, provided that the stator frequency of the asynchronous machine exceeds the rated frequency by about 10%. The integration procedure necessarily used by the voltage model, however, requires a DC contribution control, which leads, at low frequencies, to falsification of the flux determination and also impairs the control dynamics. Furthermore, to consider the ohmic voltage drop within the "voltage model" the stator resistance $R^s$, which is temperature dependent, has to be determined. Therefore, a decrease of the stator frequency effects a discrepancy of the real temperature dependent stator resistance and the parameter describing the stator resistance within the model. That leads to falsification of the flux determination and, therefore, impairs the control system. Therefore, at lower frequencies the flux determination is provided by an arithmetic model circuit, using the stator currents and the signals pertaining to the angular rotor position to electrically simulate the flux generating events within the machine. This "current model" requires an accurate knowledge of the rotor resistance $R^L$. This rotor resistance of an asynchronous machine is highly temperature dependent, therefore, the use of a motor resistance current model parameter value, adjusted to an average temperature-independent model parameter value, may lead to falsification. In such a way, the demand for a constant flux might not be reached and for example a defined starting moment cannot be provided by the machine. Furthermore, the falsification of the flux determination may impair the efficiency of the machine and may cause saturation phenomena.

SUMMARY OF THE INVENTION

1. Objects

It is therefore an object of the invention to determine the exact rotor resistance of an asynchronous machine by electrical parameters such as stator resistance, voltage and angular position of the rotor. This is achieved by the inventive method disclosed in claim 1.

2. Summary

The emf-vector of the asynchronous machine is determined from the voltage vector and from the stator current vector by means of the emf-detector. The flux vector is determined from the stator current vector, the rotor position and from a variable rotor resistance parameter by means of the arithmetic model circuit. The rotor resistance parameter represents the rotor resistance of the asynchronous machine provided that the emf-vector coincides to the model emf-vector which belongs to the model flux vector. Therefore, the model resistance parameter is controlled according to the difference of two quantities defining the emf-vector and the model emf-vector, especially the magnitudes of the vectors or the reactive components. This difference is delivered to the rotor resistance model parameter input of the arithmetic model circuit by means of a regulator.

According to claim 1, a first emf-vector, called "machine emf-vector", is computed from the stator voltages and the stator current, for example the phase voltage and the phase current of windings of an asynchronous machine. While the emf-vector e is derived from the time-dependent change of the flux, it is, therefore, possible to use the flux vector $\int e \, dt = \Psi$ as a first vector.

Simultaneous to the computation of the first vector or e or $\Psi$ the arithmetic module circuit, ("current model") is used to simulate the events generating the magnetic field within the asynchronous machine. The arithmetic model circuit is thereby fed the values of the phase currents the rotor position value and an adjustable model value corresponding to the motor resistance. A model flux vector is assigned to that simulated magnetic field, therefore, by differentiation of the model flux vector a model-emf-vector representing a second vector may be obtained. In general, according to the invention it is not necessary to determine the model flux vector $\Psi_M$ or the model emf-vector $e_M$ within both degrees of freedom (defining quantities). It is, therefore, sufficient to compute the value of one degree of freedom, for example, the magnitude of the flux vector or the magnitude $\Psi_M$ of the emf-vector. The two flux vectors $\Psi$, $\Psi_M$ or the two emf-vectors e, $e_m$ are equal if their defining quantities are equal, consequently the magnitude of the respective vectors e, $e_m$ and $\Psi$, $\Psi_M$ have to be equal.

According to the invention in order to compare the first vector with the second vector comparison of one defining quantity of the first vector with the respective quantity of the second vector is necessary. The aforementioned situation, wherein it is not necessary to compute the second vector, is as follows: For the first vector the machine flux vector $\Psi$ is used and for its defining quantity the magnitude $\Psi$ of the machine flux vector is used. Therefore, to receive the defining quantity of the respective second vector, it is necessary, according to the arithmetic model circuit, to compute the magnitude $\Psi_M$ of the model flux vector whereas there is no necessity to compute the direction of the model flux vector $\Psi_M$. Then the difference between these two defining quantities of the respective vectors is formed.

The minimize the value of the aforementioned difference, the model parameter value of the rotor resistance is varied depending on that difference. The computed value of the rotor resistance of the machine will be the value of the rotor resistance of the arithmetic model circuit attached to the minimized value of the difference.

The invention is based on the fact that, because of the common current of the machine and the current model, the congruent circle diagrams are valid. There will be different slip scales if the value of the rotor resistance of the model is different from the actual rotor resistance. Since the slip of the model and the actual machine are different, we obtain important deviations between the model flux vector and the actual flux vector. With exception of no-load operation, independent from load and frequency, the model flux is always bigger than the actual flux provided that the rotor resistance parameter value is bigger than the actual motor resistance value. Consequently by varying the parameter resistance of the current model, the model flux is adapted to the actual flux to coincide with the model flux and the machine flux, that is, by balancing these two fluxes by means of the current model, the actual rotor resistance value appears.

Thereby, other difficulties appear as the actual flux in the machine cannot be measured in direct ways except by Hall probes. By means of phase currents and phase voltages, the vector of the machine emf can be detected. This vector corresponds to the differentiation of the machine flux vector. Knowledge of the rotor resistance value is not necessary. According to the invention, in order to balance the model and the machine, a scalor quantity is defined by means of the terminal voltages and the stator currents. This scalor quantity is used as a defining quantity for the first vector corresponding to the emf of the machine. By means of the model flux used in the current model, the corresponding scalor quantity is formed. The flux vector and the emf, respectively, define a vector with two defining quantities like the components in a coordinate system adjusted perpendicularly to the axis Q rotation or the magnitude (length) of the vector and its angular position.

Consequently, the magnitude of the machine emf-vector or the machine flux vector reached by respective integration, can be used as a defining quantity of the first vector and can be compared with the magnitudes of the model-emf-vector and the model flux vector, respectively. But it is possible to compare a single component of the respective machine and model vectors.

In a first embodiment of the invention, it is possible to use the magnitude of the machine flux vector to define a defining quantity of the machine. This machine flux vector is formed by integrating the machine-emf-vector. It is advantageous, on the one hand, to form the machine-emf-vector from the vector of the stator voltage by subtraction of the ohmic voltage drop from the inductive stray voltage. The magnitude of the model flux vector is formed by the arithmetic model circuit and defining a scalor quantity of the model, corresponds to the magnitude of the flux vector.

But the integration of the machine emf within low frequency range consequently needs further efforts to control the DC component.

A preferred embodiment of the invention disregards the integration of the machine emf. For balancing purposes, it is possible to use the magnitudes of the emf-vector and the model-emf vectors, respectively. It is advantageous to form the magnitude of the model-emf-vector by differentiation of the flux vector computed by the arithmetic model circuit and subsequently forming the magnitude.

If the value of the stator resistance used to form the machine-emf-vector is known, it is possible to define the vector resistance sufficiently, as well. A tolerance of about 50% of the value of the stator resistance effects a falsification rate of about 1 to 2% of the nominal value of machine-emf. Regarding the fact that forming a vector magnitude by the arithmetic model circuit does not exclude a falsification rate of similar range, it might be possible when using very low operational frequencies with an emf of only some percent of the nominal value that the determination of the rotor resistance may include a falsification of about 100%.

Presuming there is a demand for high accuracy, even by low frequencies, it is advantageous to use the model-emf-vector determined by the current model as well as the reactive component of the machine-emf-vector as scalar quantities. The reactive component of an emf-vector is defined as the emf-component perpendicular to the stator current vector. These reactive components are dependent from the rotor resistance as the vectors of the components magnitude of the emf-vector itself.

The ohmic rotor drop might be regarded as a vector. The only difference between this vector and the stator current vector is the component comprising the stator resistance. This component is merely a drop of the active voltage, consequently it is located in parallel to the stator current vector. Thus, its value is not used to determine the reactive component of the machine emf and there is no difference between the reactive component of the machine emf and the reactive component of a vector assembled by the emf-vector and the ohmic voltage drop vector. Consequently, the determination of the reactive component of the machine emf-vector may start by forming the summation vector (defined by the emf-vector and the ohmic voltage vector) by subtracting the inductive supply voltage from the stator voltage vector, followed by using the reactive component of the assembled vector as a reactive component of the machine-emf-vector so as to compare this reactive component with the reactive component of a model-emf-vector.

In this embodiment of the invention, the only difference between the active component of the assembled machine vectors and the active component of the model-emf-vector, including the balance of the reactive components, is the ohmic voltage drop given by the multiplication of the stator resistance by the stator current. Therefore, it is possible to divide the difference between the active component of the assembled vector and the active component of the model-emf-vector when the difference of the respective reactive components is at a minimum by the magnitude of the current. The result of the division is the stator resistance of the machine.

The determination of the reactive component of a vector is done by transforming the vector in a Cartesian coordinate system, rotating with the stator current.

Consequently, one of the Cartesian components forms the active component of the vector, while the other component forms the reactive component of the vector. Therefore, it is possible to determine the scalor difference necessary for balancing the machine and the model by subjecting the machine-emf-vector (or the summation vector) and the model vector separately to an angular coordinate transformation process and then for the difference of the reactive components of both vectors. Since the coordinate transformation process includes a certain falsification rate influencing in some way the difference of the components reached by the coordinate transformation process the determination of this difference is inaccurate. This difference of the reactive components can also be reached by first forming the vector difference of these two vectors and then continuing by forming the reactive component of this difference vector according to the coordiate transformation process.

According to the previous example, it is advantageous to obtain the machine-emf-vector (or the summation vector) and the model-emf-vector from the difference vector and then to continue the coordinate-transformation process to form the reactive components. In order to use the full computation range of the coordinate transformation process, it is possible to amplify the signals belonging to the components of the difference vector fed to the transformation process by the respective amplifiers. Thereby, an increase of the accuracy of the computation process is provided without further effort.

It is possible to apply the previous examples using current oriented components of the emf-vectors as defining quantities to a situation wherein the first vector is not the machine-emf-vector e but the machine flux vector $\Psi$ which is reached by integration. Consequently, the second vector is the model flux vector $\Psi_M$ instead of the model-emf-vector $e_m$, reached by the differentiation of $\Psi_M$. It is to emphasize that the flux vector and the emf vector have a 90° shift to each other. Therefore, the emf-reactive components, for example, correspond to the flux active components. By integration of the aforementioned summation vector, we receive a vector with an active component which is different from the active component of the flux-vector by the value of the integral of the ohmic voltage drop. Therefore, it is possible to determine $R^L$ by a comparison of the active components of the integrated summation vector and $\psi_M$ and to calculate $R^s$ from the reactive component of the integrated summation vector (for example the integral of the active component of the summation vector).

For a full understanding of the present invention, reference should now be made to the following detailed description of the preferred embodiments of the invention and to the accompanying drawings.

BRIEF DESCRIPTION OF THE DRAWINGS

The invention will be described more fully on the basis of four embodiments showing apparatus to perform the method.

In the drawings.

DESCRIPTION OF THE PREFERRED EMBODIMENTS

Figure 1:
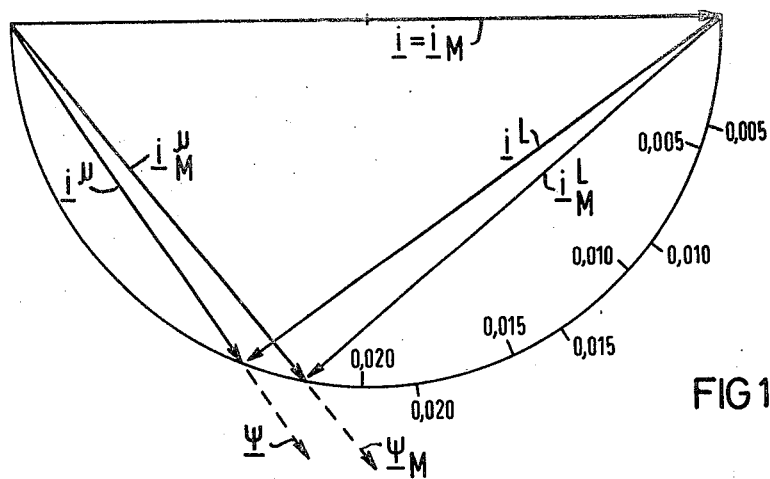
FIG. 1 shows the different circle diagrams applied to the asynchronous machine and the current model.

In a steady state the vector of the magnetic flux $i^\mu$ of the asynchronous machine is perpendicular to the rotor current $i^L$, therefore, according to the circle diagram shown in FIG. 1, these two currents are situated on a semi-circle over the stator current vector i impressed to the asynchronous machine. For a given rotor resistance $R^L$ results in a scale provided to the inside of the semi-circle that pertains to the slip frequency. Therefore, it is possible to determine, by the circle diagram, the magnetizing current vectors and the rotor current vectors belonging to the respective slip frequency provided that the rotor resistance is given.

Since the current model presumes the same impressed stator current, the model has the same circle diagram but there are different slip scales if the parameter $R_H{}^L$ of the rotor resistance used in the model does not coincide with the rotor resistance of the machine. In FIG. 1, a slip scale of the model provided on the outside of the semi-circle applies to $R_H{}^L > R^L$. Assuming a slip frequency of 0.025 there results the shown vector for the model magnetizing current $i_M{}^\mu$, which is different from the magnetizing current $i^\mu$ of the machine belonging to the same slip frequency with respect to position and magnitude. Different vectors of the flux vector $\Psi$ or $\Psi_M$ correspond to different magnetizing currents of the machine. According to the invention, these differences between the vectors $\Psi$ and $\Psi_L$ or the respective emf vectors e and $e_M$ are used as a defining quantity for the coincidence of themodel parameter $R_M{}^L$ and the actual machine vector resistance $R^L$. The defining quantity can use the magnitude of the vectors or the projection of these vectors on the stator current vector i, or an axis perpendicular to that because there is a definite monotone connection between these quantities and the difference $R_M{}^L - R^L$.

Therefore, the parameter of the rotor resistance of the model is varied as long as these two slip scales coincide, that is until the vectors $\Psi$ and $\Psi_M$ are synchronous.

The flux of the machine represents the integral of the emf of the machine and can be detected by an embodiment of an apparatus to perform the method according to the invention from available defining quantities of the machine (such as stator current and phase voltage) by use of an emf detector. Furthermore, we need an arithmetic model circuit also using the actual machine current and further information about the position of the rotor and using a variable model quantity $R_M{}^L$. The arithmetic model circuit is used to simulate the events generating the magnetic field and produces a flux simulating vector describing this field by model. In a computer stage fed by the emf-detector and the arithmetic model circuit, there are formed two comparable quantities, the first of the quantities represents a defining quantity of the emf-vector of the machine and the second quantity a respective defining quantity of the emf-vector of the model reached by differentiation of the flux vector. Since the emf-vector or the flux vector represent a plane vector given by magnitude and direction (angle) or its components in a given plane coordinate system, the defining quantity can be the magnitude or a component of the vector, especially of a reference system rotating with the stator current. The embodiment shown in FIG. 2 does not use the emf-vectors of machine and model as vector quantities, but the machine flux vector formed by integration of the machine emf-vector and the model flux vector determined by the current model. The computer stage determines a scalor quantity by subtraction representing the difference between these defining quantities. This difference is fed to the input of a controller which output is connected to the input of the rotor resistance within the arithmetic model circuit.

Figure 2:
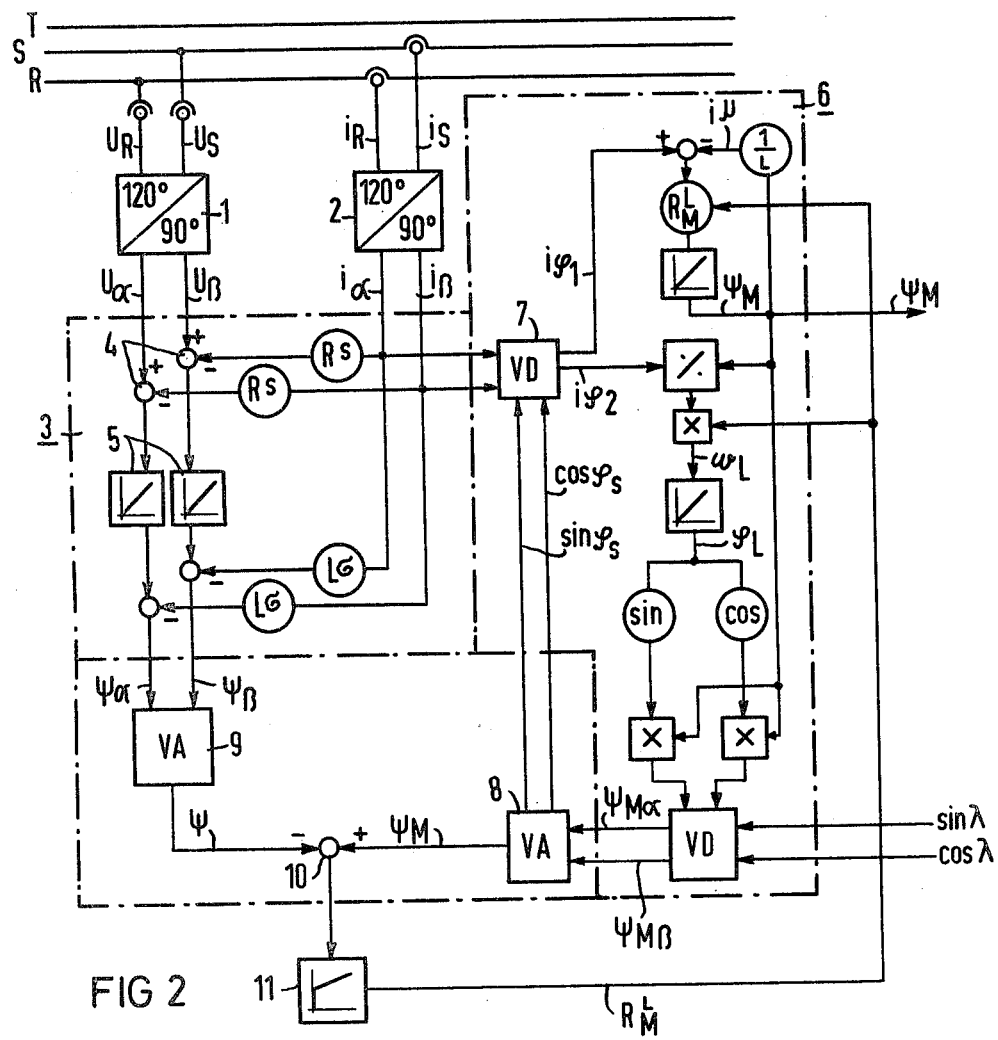
FIG. 2 shows a first embodiment of the apparatus to perform the method according to the invention.

According to the embodiment shown in FIG. 2, from the supply lines R, S and T of the asynchronous machine, two terminal voltages $U_R$ and $U_S$ and two phase currents $i_R$ and $i_S$ are picked off representing the components of the voltage vector U or the stator current vector i in a coordinate system adjusted to an angle of 120° according to the direction of the axes of the respective windings. The vectors are transformed by means of vector rotator 1,2 in a Cartesian coordinate system stationarily fixed to the stator system of the asynchronous machine. In the following, the Cartesian components of a vector within this stationary rotor reference system are marked by subscripts $\alpha$ and $\beta$.

The respective component of the ohmic voltage drop is subtracted from a component of the voltage vector by means of an emf-detector 3 designed to detect the machine flux. This ohmic voltage drop results from the respective component of the stator current vector multiplied by a factor related to the stator resistance $R^s$ of the asynchronous machine (subtraction circuit 4). A flux vector $\Psi$ belonging to the emf-vector of the machine is supplied by integrating means (integrator 5). To compensate for the inductive spray voltage, the product of the respective component of the stator current and a factor corresponding to the spray capacity $L^\sigma$ is subtracted from the vector components. The rotor reference system components $\Psi_\alpha$ and $\Psi_\beta$ of the machine flux vector appear at the output of the emf-detector 3.

Furthermore, an arithmetic model circuit 6 is provided, representing a current model of the asynchronous machine and supplied by the rotor current components $i_\alpha$ and $i_\beta$ as well as the rotor position input $\sin\lambda$, $\cos\lambda$. $\lambda$ represents the angle of the rotor axis relative to one coordinate of the stator reference system. By means of its two Cartesian stator-reference coordinates $\Psi_{M\alpha}$ and $\Psi_{M\beta}$ the model flux vector $\Psi_M$ appears at the output of that current model. It may be sufficient to extract merely the flux vector magnitude from the arithmetic model circuit.

In an arithmetic model circuit of the current model, schematically shown in FIG. 2, the rotor reference components of the stator current vectors are transformed by a vector rotator 9 in a "field-oriented" coordinate system synchronously rotating with the flux vector. In the following, subscript $\Psi_1$ marks a component of a vector parallel to the flux vectors.

Subscript $\psi_2$ marks a component of a vector perpendicular to that direction. The field-oriented coordinate system results from a rotation of the stator reference coordinate system by the angle $\psi_S$ of the flux vector defined in the stator reference coordinate system.

In a steady state, the field-parallel component $i_{\psi1}$ is equal to the magnetizing current $i^\mu$ of the asynchronous machine. During dynamic events there is a surplus of $i_{\psi1}$ to the magnetizing current $i^\mu$ which leads to a change of the field strength within the machine. Consequently the arithmetic model circuit first forms the difference $i_{\psi1}-i^\mu$, followed by multiplication with the value of the parameter of the rotor resistance which results in a change of the field strength, then are integrated and the field strength finally appears by means of the magnitude of the flux vector.

Since the magnitude of the flux vector is given by the product of the magnetizing current $i^\mu$ and the main field magnetizing inductance L of the machine, the necessary value of the magnetizing current $i^\mu$ can be picked off at the output of the integrator by means of a multiplication circuit (multiplication factor 1/L).

The slip frequency (angular velocity $\omega_L$), belonging to the active component of the stator current and to the given model flux $\Psi_M$, is obtained by forming the $i_{\psi2}/\Psi_M$ quotient followed by multiplication by $R_M{}^L$. Further integration forms the angle $\Psi_L$ between the flux vector and the axis of the rotor winding. The components of the model flux vector described by the rotor reference system, rotating synchronously with the rotor axis, are obtained by means of an angular function circuit and by multiplication by the magnitude $\Psi_M$ of the model flux. These components are re-transformed to the stator reference system by coordinate transformation. Therefore, a further vector rotator is necessary and fed by the respective rotor position inputs $\sin\lambda$, $\cos\lambda$.

The components $\Psi_\alpha$, $\Psi_\beta$ and $\Psi_{M\alpha}$, $\Psi_{M\beta}$ are fed into vector analyzer 8, 9 which form the magnitude $\Psi$ or $\Psi_M$ of the model flux vector. That vector analyzer forms the magnitude, sine and cosine of the angle from the Cartesian components of a vector. Therefore, the respective angular information of the vector analyzer 8 can be fed to the vector rotator 7 arranged at the input of the arithmetic model circuit 6.

Since $\Psi_M-\Psi$ is proportional to $R_M{}^L-R^L$, the difference of the scalor quantities $\Psi$ and $\Psi_M$ (subtraction stage 10) can be used as a regulating system deviation to adjust the parameter of the rotor resistance $R_M{}^L$ within the arithmetic model circuit. Therefore, a controlling element is connected in series to the subtraction stage 10 where an output is connected and multiplication by $R_M{}^L$ is provided within the arithmetic model circuit.

Figure 3:
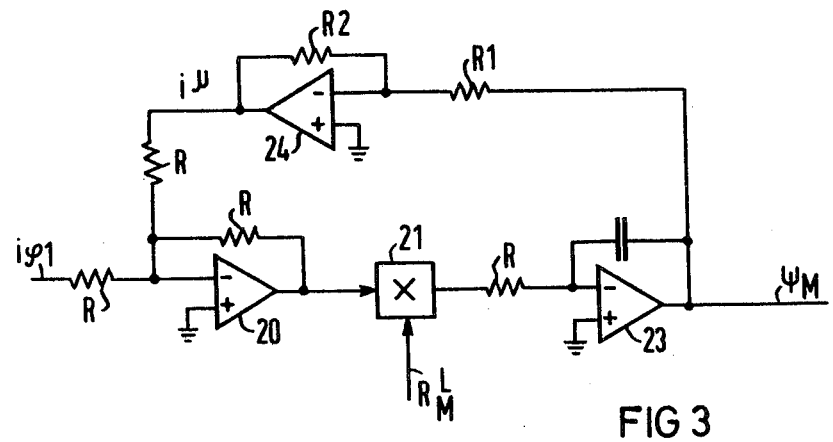
FIGS. 3 and 4 disclose details of the circuit shown in FIG. 2.

For forming the magnitude $\Psi_M$ of the model flux vector from the stator current $i_{\psi1}$ and the parameter $R_M{}^L$, there is provided a decisive event within the arithmetic model circuit. An embodiment comprising a circuit arrangement is shown in FIG. 3 in more detail. At first, the respective voltages are superimposed upon an amplifier 20 to obtain $i_{\psi1}-i^\mu$ and then the amplified output signal is multiplied by the fed-in model parameter $R_M{}^L$. Thereafter, an integration 23 follows, which output shows the magnitude $\Psi_M$ of the model flux vector. In a feed-back loop, the output voltage of the integrator 23, amplified by an amplifier 24 with an R1/R2=L resistor arrangement, is superimposed upon the input of the amplifier 20 by a respective voltage $i^\mu$.

Figure 4:
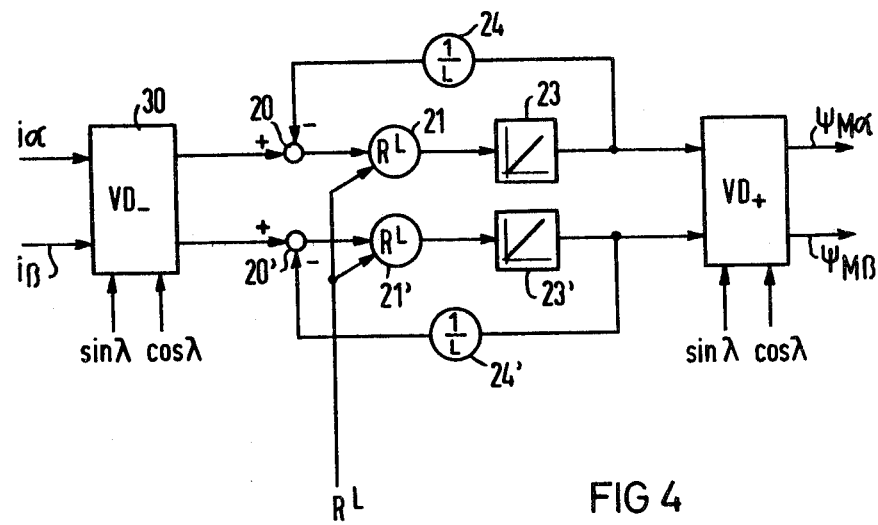

The current model described above satisfies the differential equations of the asynchronous machine in a field-oriented coordinate system. But it is also possible to solve the equations within the rotor oriented reference system. A suitable arithmetic model circuit is shown in FIG. 4. Therefore, a stator current vector given within the rotor reference system is transformed in a reference system rotating synchronously with the rotor axis by means of a first vector rotator 30 fed by the rotor position $\lambda$ or respective trigonometric functions $\sin\lambda$, $\cos\lambda$ in the rotor reference system. Since the magnetizing current is always parallel to the flux vector and, therefore, having only one $\Psi$ component in the field-oriented system, besides two components to describe it by the rotor oriented reference system the circuit arrangement shown in FIG. 4 is different from the circuit arrangement in FIG. 3. Each of the two rotor oriented components of the stator current and of the magnetizing current request one circuit arrangement as shown in FIG. 3 to solve the respective differential equations. The necessary circuit elements in FIG. 4, similar to FIG. 3, are marked by reference symobls 20 through 24 and 20' through 24'. Thereby the components of the flux vector $\Psi_M$ in the rotor oriented reference system are obtained. Later these components are transformed according to the rotor position from a rotor oriented reference system to the stator oriented reference system by means of a vector rotation 31. Therefore, it is possible to feed the stator oriented components $\Psi_{M\alpha}$ and $\Psi_{M\beta}$ to the vector analyzer shown in FIG. 2.

Figure 5:
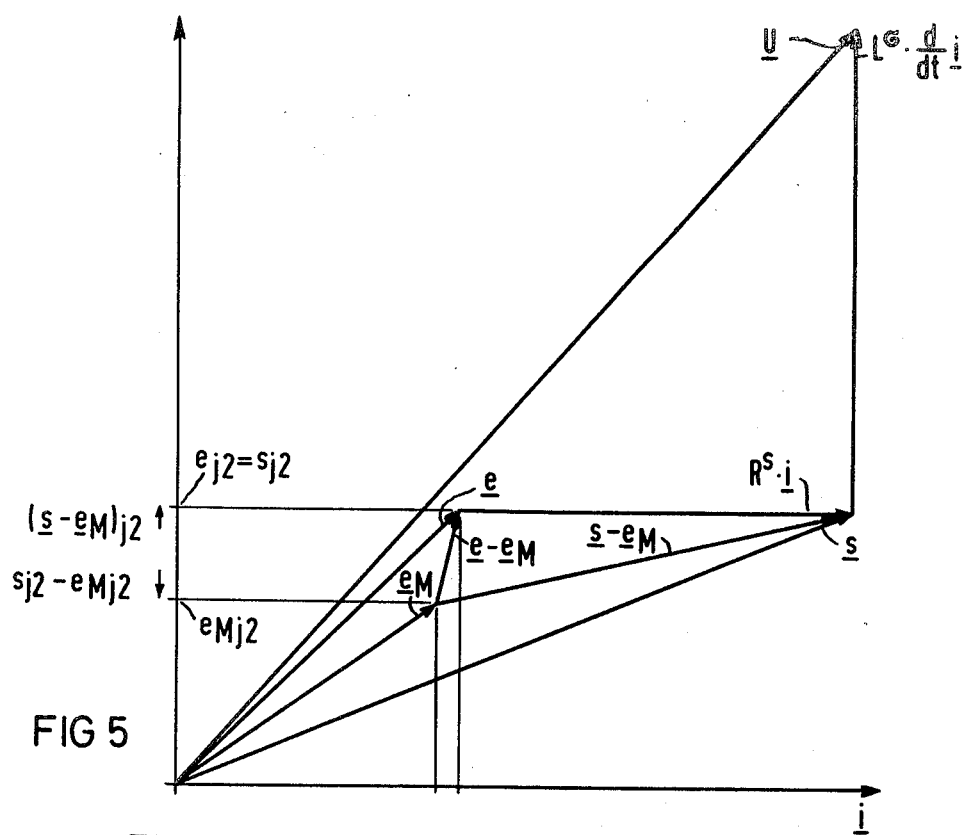
FIG. 5 shows a vector diagram of the model-emf-vector and the machine-emf vector.

For further illustration, FIG. 5 shows the stator vector i and the voltage vector V. It is possible to describe the emf-vector e of the machine by the equation $e = V - L\sigma \cdot d/dt\, i - R^s i^s$. Additionally, FIG. 5 shows the respective model-emf-vector e obtained by the current model at the parameter value $R_M{}^L < R^L$. Since $e_M - e$ and $R_M{}^L - R^L$ are proporational, it is possible to use the magnitudes e, $e_M$ of the emf-vectors to adjust the model parameters in the arithmetic model circuit. It is also possible to use the projection of the vectors e, $e_M$ on an axis perpendicular to the stator current vector i that is the reactive components of these vectors marked by reference symbols $e_{j2}$ and $e_{Mj2}$ because of the same proportionality. These two variations are used in the embodiments shown in FIGS. 6 and 7. FIG. 5 teaches that the reactive component $e_{j2}$ of the machine-emf-vector e is equal to the reactive component $s_{j2}$ of a summation vector defined by $s = e + R^s \cdot i$ is obtained by the stator voltage vector U and the inductive spray voltage according to the equation $S = U - L \cdot d/dt\,(i)$. Thus dependency as used in the embodiment is shown in FIG. 8.

FIG. 5 additionally teaches that the difference of the reactive components ($e_{j2} - e_{Mj2}$ or $S_{j2} - e_{Mj2}$) of the vectors e and $e_M$ or s and $e_M$ is equal to the reactive component of the different vectors $e - e_M$ or $s - e_M$. The interchangeability of the differentiation process and the procedure for reaching the reactive components is also used with reference to FIG. 8.

Figure 6:
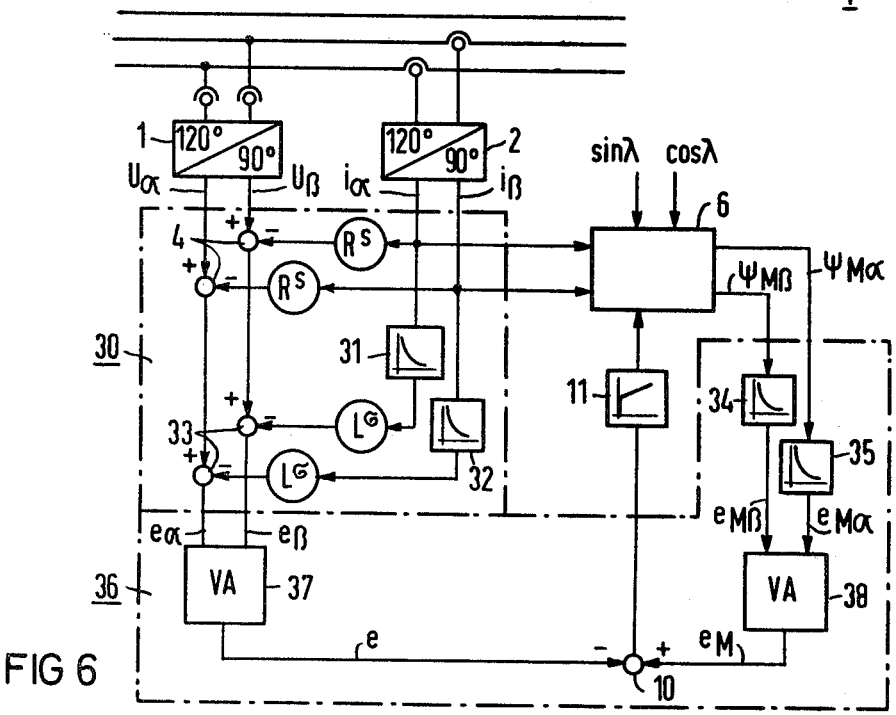
FIG. 6 shows a second embodiment of an apparatus according to the invention as well as a detail of the circuit.

The embodiment according to FIG. 6 shows, similar to FIG. 2, coordinate transformer 1 and 2, an arithmetic model circuit 6 which is described according to FIGS. 3 or 5, and a controlling element 11 connected to the input 12 of the rotor resistance parameter $R_M{}^L$. In contrast to FIG. 2 the emf-detector 30 does not provide the integration of the machine emf-vector to obtain the flux vector, but after forming $U - R^s \cdot i$ (subtraction point 4), the components $e_\alpha$ and $e_\beta$ of the machine emf-vector e are obtained in stator oriented coordinates by superimposing over the subtraction points 33 without integration the spray voltage drop $L^\sigma \cdot d/dt\,(i_\alpha)$ and $L^\sigma \cdot d/dt\,(i_\beta)$. The spray voltage is provided by means of differentiation elements 31 and 32 attached to the stator current components $i_\alpha$ and $i_\beta$ To receive the model emf-vector $e_M$ as a similar quantity to the model flux vector $\Psi_M$ provided by the current model, the components $\Psi_{M\alpha}$ and $\Psi_{M\beta}$ are differentiated by means of differentiation elements 34 and 35.

For balancing purposes of the rotor resistance parameter, it is further necessary to obtain by means of a computer stage 36 a scalar quantity, which is feedable to the control element 11. The magnitude of the two emf-vectors is provided therefore.

In this case, the magnitude forming is done by vector analyzer 37 and 38 fed by the vectors e and $e_M$. The magnitude of the vectors appears at the output of these vector analyzers and is fed to the subtraction point 10 attached to the input of the control element 11.

Figure 7:
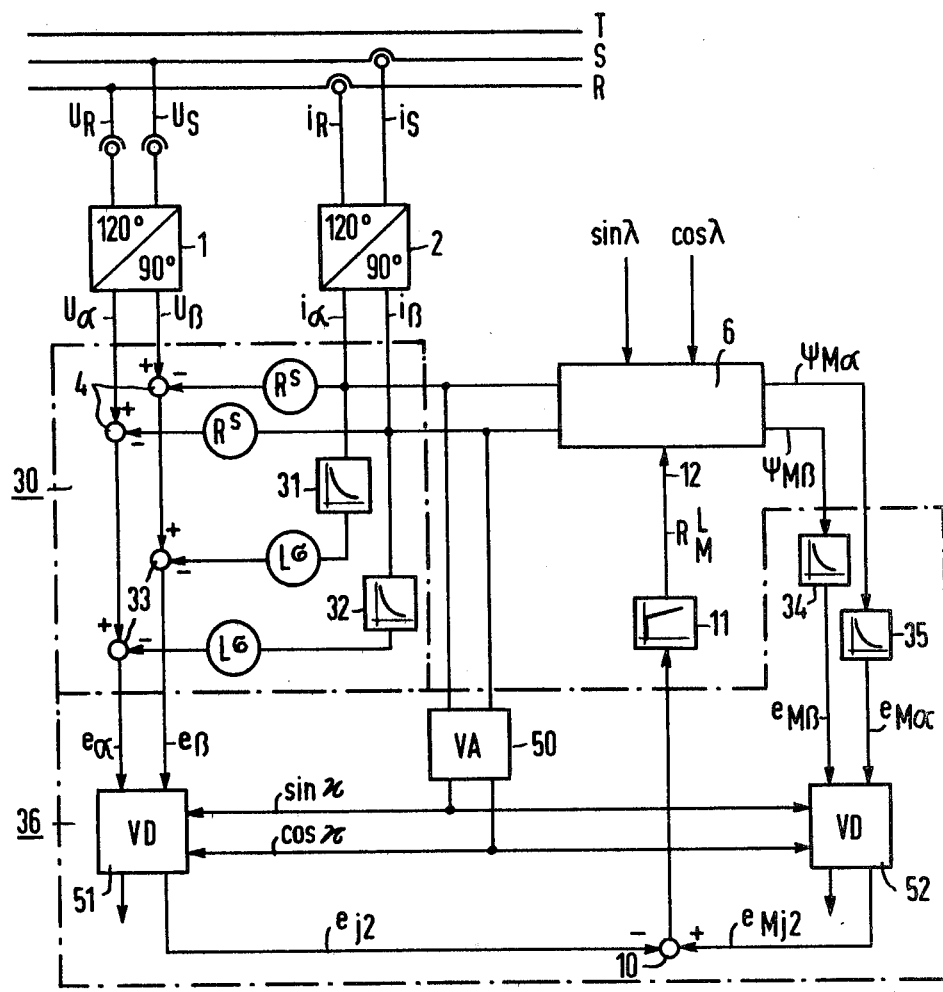
FIGS. 7 and 8 concern further advantageous embodiments according to the invention.
Figure 8:
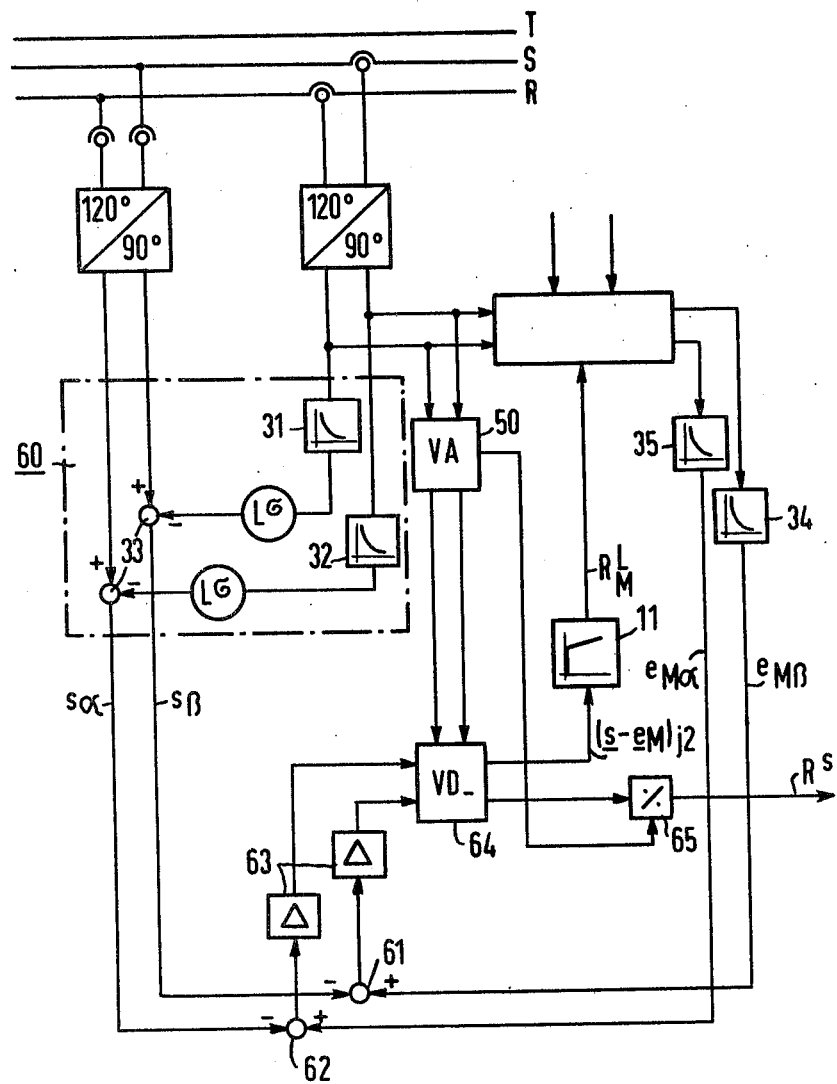

According to FIG. 7 to obtain the scalar quantity input of the control unit 11 instead of the magnitudes, the reactive components $e_{j2}$ and $e_{Mj2}$, respectively, are used. It is advantageous to form the reactive components by feeding the vector analyzer 50 with the components $i_\alpha$ and $i_\beta$.

Of all the output quantities provided by the vector analyzer 50, only the information pertaining to the angular position of stator current vector is necessary. The respective signals $\sin\eta$ and $\cos\eta$ are supplied to the vector rotator 51 and 52, arranged to transform the emf-vector e and $e_N$ into the reference system rotating synchronously with the stator current vector. Furthermore, of the output quantities of the vector rotators 51 and 52, only the components perpendicular to the stator current vector such as the reactive components $e_{j2}$, $e_{Mj2}$ are needed and delivered to the subtraction point 10.

As mentioned, before, it is advantageous to interchange the reactive components forming process and the differentiation process. In that case the vectors e and $e_M$ are subtracted by their respective components and the resulting difference vector is submitted to a coordinate transformation process by means of a vector rotator. In this procedure, only the reactive component of the difference vector is used as a scaler input quantity for the controlling element 11.

The embodiment shown in FIG. 8 performs this interchange of the reactive component forming process and the differentiation process. The components $e_{M\alpha}$ and $e_{M\beta}$ of the model emf-vector $e_M$ are obtained analogous to FIG. 7. For the defining quantity of the machine emf-vector its reactive component is used, but in this case it is formed as a reactive component of the aforementioned summation vector defined by $s = e + R^s i$. Therefore, the stator oriented components $s_\alpha$, $s_\beta$ of this summation vector s are formed by subtracting the inductive spray voltage from the stator voltage vector (components $U_\alpha$, $U_\beta$) disregarding the ohmic stator resistance (subtraction point 4, FIGS. 2, 6 and 7).

The vector s detected by the emf-detector 60 is subtracted by the components at the subtraction points 61 and 62. The components of the resulting difference vector are supplied by means of amplifiers 63 to a vector rotator 64 superimposed according to FIG. 7, by the angular quantities of the vector analyzer 50. The reactive component ($s - e_{Mj2}$) of the difference vector is supplied to the input of controlling element 11.

For some applications it is advantageous to have some information about the stator resistance $R^s$ of the asynchronous machine. According to the embodiment shown in FIG. 8, this can easily be done by delivering the active component of the difference vector ($s - e_M$) to an input of a divider 65 whose dividing input is superimposed by the magnitude of the stator current detected by the vector analyzer 50. The output of the divider 65 provides the stator resistance $R^s$.

According to the equation $\Psi = \int e\, dt$, it is possible to eliminate the differentiation elements 34, 35 in the embodiments shown in FIGS. 6 through 8, provided that integrators according to the integrator 5 in FIG. 2 are used within the emf-forming circuit or that an integrator is arranged at the output of the emf-forming circuit. Here instead of applying e and $e_M$ in the first and second vector $\Psi$ and $\Psi_M$ are applied. Because of the subsequent 90° rotation, it is necessary to change outputs of the vector rotator 51 and 52 to substitute the former active component (index j2) of the emf vectors by the active component of the flux vector (index j1).

Aside from these adjustments, the circuit arrangements remain unchanged.

There has thus been shown and described a novel method and apparatus for determining the rotor resistance of an asynchronous machine which fulfills all the objects and advantages sought therefore. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method to detect the rotor resistance of an asynchronous machine, wherein
   a first vector attached to the emf of the machine is determined by computing the emf-vector or the flux vector from the stator voltages and the stator currents;
   a flux attached to an arithmetic model circuit is determined, whereas the arithmetic model circuit uses the stator currents and the rotor position of the machine and an adjustable model parameter for the rotor resistance as basic quantities and imitates the dynamic events leading to the magnetic flux of the machine;
   a difference of two quantities is determined, wherein the first quantity represents a defining quantity of the first vector attached to the machine and the second quantity represents a respective defining quantity of a second vector derivable from the imitated flux and that
   the setting of a model parameter is varied until the value of the difference is a minimum, whereas the model parameter corresponding to the minimum of the difference is regarded as the resulting rotor resistance of the machine.

2. A method according to claim 1, wherein for defining machine quantity, the magnitude of the machine flux vector obtained by integrating the machine emf-vector is taken, and for defining model quantity the magnitude of the imitated flux is taken.

3. A method according to claim 1, wherein for defining quantities the magnitudes of the machine emf-vector and of a model emf-vector representing the second vector and computed from the imitated flux, are taken.

4. A method according to claim 3, wherein the magnitude of the model emf-vector is obtained by differentiation of the flux vector computed from the imitated flux followed by forming the magnitude.

5. A method according to claim 2 through 4, wherein the machine emf-vector is obtained from the stator voltage vector subtracted by the ohmic voltage drop and the inductive spray voltage.

6. A method according to claim 1, wherein for defining quantities the reactive components of the machine emf-vector representing the first vector, and a model emf-vector computed from the imitated flux, or, the active component of the machine flux vector representing the first vector, and a model flux vector computed from the imitated flux and representing the second vector, are taken.

7. A method according to claim 6, wherein the reactive component of the machine emf-vector is obtained by forming the summation vector from the machine emf-vector and the ohmic voltage drop or, alternately, the active component is obtained by integrating the reactive component of the summation vector, whereas this summation vector is formed by the difference of the stator voltage and the inductive spray voltage.

8. A method according to claim 7 wherein for a further difference, the difference of the other components of the first and the second vector is formed, and that this further difference is divided by the magnitude of the stator current, and that the value corresponding to the minimum of the difference is used as the value of the stator assistance.

9. A method according to claims 6 through 8, wherein the difference of the reactive components or the active components is obtained by forming the reactive or active component, respectively, of the difference of the vectors.

10. Apparatus for performing the method according to claims 1 through 9, comprising:
    (a) an emf-detector fed by the phase currents and the phase voltages arranged to obtain a first vector attached to the emf of the machine;
    (b) an arithmetic model circuit fed by the phase currents and by a rotor position signal arranged to imitate the events leading to the flux of the machine taking into consideration the machine parameter comprising an input for the parameter of the machine's rotor resistance and an output for an output signal representing the magnitude of the imitated flux or for output signals representing the vector components of the imitated flux;
    (c) a computer stage arranged to obtain a scalar quantity defining the machine emf-vector and a respective scaler quantity defining a second vector attached to the imitated flux and
    (d) a controlling element comprising an input fed by the difference of the defining quantities obtained by the computer stage, and an output connected to the input of the arithmetic model circuit.

11. An apparatus according to claim 10, wherein the machine emf-vector and the model flux vector are obtained by determination of its components within a given reference system, that either the computer stage comprises differentiation elements for differentiation of the components of the model flux vector, or the emf-detector comprises integrators for an integration of the components of the machine emf-vector and that the computer stage furthermore comprises a device to determine the difference of the magnitudes of the vectors from the components of the machine emf-vector and the differentiated model flux vector, or, alternately, from the components of the integrated machine-emf-vector and the model flux vector.

12. An apparatus according to claim 10, wherein the machine emf-vector is obtained by means of the emf-detector and the model flux vector is obtained by means of arithmetic model circuit both vectors are determined by their components within a given coordinate system, that either the computer stage comprises differentiation elements arranged for a differentiation of the components of the model-flux vector or the emf-detector comprises integrators arranged for an integration of the components of the machine emf-vector, and that the computer stage further comprises a vector analyzer fed by the stator currents and arranged to provide current angular quantities describing the position of the stator current vector within this coordinate system as well as comprises a device fed by these current angular quantities forming by coordinate transformation the components of the machine emf-vector and the differentiated model-flux-vector perpendicular to the stator current vector or, alternately, the components of the integrated machine-emf-vector and the model-flux-vector parallel to the stator current vector, and supplying them to input of the controlling element for subtraction of the scalar defining quantities.

13. An apparatus according to claim 12, wherein the summation vector instead of the emf-vector is obtained by means of the emf-detector using the machine emf-vector and the ohmic voltage drop as basic quantities in that way that mostly the product of a quantity representing the spray inductivity and the result of the differentiation with respect to the time of the stator current components is subtracted from the components of the voltage vector.

14. An apparatus according to claims 12 or 13, wherein the subtraction of the components of these two vectors is done in the way that the components of the one vector are supplied to the respective amplifiers superimposed in a subtracting way by the respective components of the other vector and that the outputs of the amplifiers are connected to the coordinate transforming device.

15. An apparatus according to a combination of the claims 13 and 14, wherein the device arranged for coordinate transformation transforms the other component of the fed vector as well as supplies it to the input of a divisor and that the vector analysis fed by the stator current forms the magnitude of the stator current and supplies it to the dividing input of the divisor and that the stator resistance of the machine appears at the output of the divisor.

* * * * *